(12) United States Patent
Hensel et al.

(10) Patent No.: US 12,183,710 B2
(45) Date of Patent: Dec. 31, 2024

(54) METHOD FOR PRODUCING CONDUCTIVE TRACKS, AND ELECTRONIC MODULE

(71) Applicant: Siemens Aktiengesellschaft, Munich (DE)

(72) Inventors: Alexander Hensel, Röttenbach (DE); Stefan Stegmeier, Munich (DE); Caroline Cassignol, Munich (DE); Dulijano Pecanac, Munich (DE); Oliver Raab, Ortenburg (DE); Erik Weisbrod, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 122 days.

(21) Appl. No.: 17/270,562

(22) PCT Filed: Aug. 30, 2019

(86) PCT No.: PCT/EP2019/073171
§ 371 (c)(1),
(2) Date: Feb. 23, 2021

(87) PCT Pub. No.: WO2020/043863
PCT Pub. Date: Mar. 5, 2020

(65) Prior Publication Data
US 2021/0202434 A1   Jul. 1, 2021

(30) Foreign Application Priority Data
Aug. 30, 2018 (DE) .................... 10 2018 214 778.7

(51) Int. Cl.
*H01L 23/00* (2006.01)
*H01L 23/373* (2006.01)

(52) U.S. Cl.
CPC .......... *H01L 24/82* (2013.01); *H01L 23/3735* (2013.01); *H01L 24/24* (2013.01);
(Continued)

(58) Field of Classification Search
CPC ...... H01L 24/82; H01L 23/3735; H01L 24/24
See application file for complete search history.

(56) References Cited

U.S. PATENT DOCUMENTS 4,693,778 A * 9/1987 Swiggett ................ H05K 3/103
156/499
5,877,093 A 3/1999 Heffner et al. ............... 438/761
(Continued)

FOREIGN PATENT DOCUMENTS

DE        10007981 A1    11/2000   ............... B05C 1/00
DE   102013211142 A1    12/2014   ............... G01P 15/00
(Continued)

OTHER PUBLICATIONS

Search Report for International Application No. PCT/EP2019/073171, 14 pages, Jan. 9, 2020.
(Continued)

*Primary Examiner* — Nathan W Ha
(74) *Attorney, Agent, or Firm* — Slayden Grubert Beard PLLC

(57) ABSTRACT

Various embodiments include a method for producing a least one conductive track comprising: forming a surface with a thermoplastic; and depositing conductive track material on the surface by thermal spraying.

8 Claims, 1 Drawing Sheet

(52) U.S. Cl.
CPC ........... H01L 2224/24051 (2013.01); H01L 2224/24225 (2013.01); H01L 2224/245 (2013.01); H01L 2224/82101 (2013.01); H01L 2924/13055 (2013.01); H01L 2924/15787 (2013.01)

(56) References Cited

U.S. PATENT DOCUMENTS

| | | | | |
|---|---|---|---|---|
| 5,939,146 | A * | 8/1999 | Lavernia | C23C 4/126 29/DIG. 39 |
| 6,548,895 | B1 | 4/2003 | Benavides et al. | 257/712 |
| 7,402,457 | B2 * | 7/2008 | Hase | H01L 24/24 257/E23.187 |
| 7,427,532 | B2 * | 9/2008 | Seliger | H01L 24/24 438/106 |
| 8,932,346 | B2 * | 1/2015 | Kuehling | A61P 43/00 623/1.46 |
| 9,744,644 | B2 * | 8/2017 | Spires | B05D 3/12 |
| 11,313,243 | B2 * | 4/2022 | Shi | F01D 11/122 |
| 11,529,623 | B2 * | 12/2022 | Ozaki | B01J 23/34 |
| 2001/0012693 | A1 * | 8/2001 | Talwar | H01L 21/76895 257/E21.336 |
| 2002/0056473 | A1 * | 5/2002 | Chandra | C23C 4/00 438/98 |
| 2005/0032347 | A1 | 2/2005 | Hase | 438/612 |
| 2005/0185518 | A1 * | 8/2005 | Kawakami | C23C 14/205 368/232 |
| 2005/0208325 | A1 * | 9/2005 | Kawakami | C23C 28/321 428/336 |
| 2009/0136747 | A1 * | 5/2009 | Kikuchi | C10M 125/00 428/458 |
| 2009/0202846 | A1 * | 8/2009 | Jayaraman | B05D 1/08 427/446 |
| 2009/0237786 | A1 * | 9/2009 | Yoshihara | G02B 1/105 428/212 |
| 2010/0072435 | A1 * | 3/2010 | Honda | H01B 1/22 427/314 |
| 2010/0183915 | A1 * | 7/2010 | Tamachi | H01M 50/121 429/185 |
| 2010/0184253 | A1 * | 7/2010 | Hirai | H01L 29/7869 438/104 |
| 2011/0070795 | A1 * | 3/2011 | Prudhomme | B32B 25/20 428/447 |
| 2011/0267673 | A1 * | 11/2011 | Agrawal | G02F 1/155 977/932 |
| 2011/0300664 | A1 * | 12/2011 | Chung | H01L 31/0512 257/E31.117 |
| 2012/0111851 | A1 * | 5/2012 | Hyllberg | B29C 48/83 29/592.1 |
| 2012/0219609 | A1 * | 8/2012 | Howland | A01N 25/34 424/404 |
| 2013/0029173 | A1 * | 1/2013 | Weir | C09J 5/02 428/223 |
| 2013/0037089 | A1 * | 2/2013 | Sasaki | H01M 14/005 136/251 |
| 2013/0177277 | A1 * | 7/2013 | Fujiwara | G02B 6/32 264/1.24 |
| 2013/0189907 | A1 * | 7/2013 | Kubo | B24B 37/26 451/527 |
| 2013/0269897 | A1 * | 10/2013 | Angerler | D21H 25/10 162/280 |
| 2014/0011006 | A1 * | 1/2014 | Guinaldo Fernandez | B64C 1/40 428/220 |
| 2014/0227551 | A1 * | 8/2014 | Rateiczak | C23C 4/06 427/455 |
| 2014/0333199 | A1 * | 11/2014 | Wang | H01L 33/507 313/512 |
| 2014/0373918 | A1 * | 12/2014 | Hensel | H01L 31/068 438/66 |
| 2015/0020877 | A1 * | 1/2015 | Moslehi | H01L 31/1896 438/57 |
| 2015/0072473 | A1 * | 3/2015 | Lam | B23K 1/0016 438/106 |
| 2015/0174686 | A1 * | 6/2015 | Shirinov | B23K 10/027 219/121.46 |
| 2015/0327403 | A1 * | 11/2015 | Naoe | H01L 23/36 361/711 |
| 2016/0265133 | A1 * | 9/2016 | Bottero | C25D 7/00 |
| 2017/0018526 | A1 * | 1/2017 | Rusli | H01L 21/565 |
| 2017/0325290 | A1 * | 11/2017 | Kabelitz | H01B 1/026 |
| 2018/0025955 | A1 * | 1/2018 | Rusli | H01L 23/5226 438/108 |
| 2018/0033738 | A1 * | 2/2018 | Kawabata | H01L 23/49838 |
| 2018/0078048 | A1 * | 3/2018 | Pearce | A47C 27/12 |
| 2018/0158782 | A1 * | 6/2018 | Kawabata | H01L 24/97 |
| 2018/0178485 | A1 * | 6/2018 | Hoshino | B32B 27/34 |
| 2018/0292308 | A1 * | 10/2018 | Hoshino | B32B 27/365 |
| 2019/0013516 | A1 * | 1/2019 | Herle | H01M 4/366 |
| 2019/0225553 | A1 * | 7/2019 | Bouton | C04B 35/62222 |
| 2019/0233946 | A1 * | 8/2019 | Bruton | C23C 28/321 |
| 2019/0240961 | A1 * | 8/2019 | Wada | B32B 9/04 |
| 2020/0040201 | A1 * | 2/2020 | Song | C09D 161/16 |
| 2020/0040214 | A1 * | 2/2020 | Song | B05B 15/00 |
| 2020/0043820 | A1 * | 2/2020 | Oh | H01L 24/97 |
| 2020/0361181 | A1 * | 11/2020 | Hosoda | C09D 201/00 |
| 2021/0238450 | A1 * | 8/2021 | Galush | C09D 5/002 |
| 2021/0376218 | A1 * | 12/2021 | Todaka | H01L 35/32 |

FOREIGN PATENT DOCUMENTS

| | | | | |
|---|---|---|---|---|
| JP | 06302721 | A | 10/1994 | ............ H01L 23/14 |
| JP | 11106701 | A | 4/1999 | ............ B05D 1/10 |
| WO | 94/07611 | A1 | 4/1994 | ............ C23C 4/00 |
| WO | 03 030247 | | 4/2003 | ............ H01L 21/60 |
| WO | 2017 055244 | | 4/2017 | ............ H01L 23/485 |

OTHER PUBLICATIONS

Seiji Kuroda et al., "Warm spraying—a novel coating process based on high-velocity impact of solid particles," Science and Technology of Advanced Materials, vol. 9, 2008—Issue 3, 18 pages, 2008.
German Search Report, Application No. 102018214778.7, 9 pages.
Chinese Office Action, Application No. 201980056781.7, 8 pages, Feb. 23, 2024.

* cited by examiner

METHOD FOR PRODUCING CONDUCTIVE TRACKS, AND ELECTRONIC MODULE

CROSS-REFERENCE TO RELATED APPLICATIONS

This application is a U.S. National Stage Application of International Application No. PCT/EP2019/073171 filed Aug. 30, 2019, which designates the United States of America, and claims priority to DE Application No. 10 2018 214 778.7 filed Aug. 30, 2018, the contents of which are hereby incorporated by reference in their entirety.

TECHNICAL FIELD

The present disclosure relates to electronics. Various embodiments many include methods for producing conductive tracks and/or electronic modules.

BACKGROUND

In microsystems technology and electronics, for instance power electronics, it is necessary for passive components, semiconductor components and substrates, such as printed circuit boards, for example, to be electrically conductively connected to one another by means of a build-up and connection technique. It is known for components to be electrically conductively linked to a substrate by means of adhesive bonding, soldering, diffusion soldering or sintering.

For electrical contacts remote from the substrate, it is known to use so-called wire bonding technology, also called ribbon bonding technology. In the case of wire bonding technology, however, it is necessary to exert compressive forces that can damage electrical components such as, in particular, semiconductor components. Moreover, in the case of wire bonding technology, local temperature increases occur during operation owing to the small cross section of wires used during bonding, and they have to be taken into account in the layout of electronic modules. Furthermore, electrical inductances occur on account of the bonded wires used and can lead to electrical disturbances. Furthermore, the conductive track routing is greatly limited in the case of wire bonding technology.

A planar build-up and connection technique can also be used as an alternative to wire bonding technology. However, the production of planar conductive tracks is often difficult to realize or realizable only in very specific applications. In this regard, for instance, the sintering of conductive tracks requires high pressures, while the known silver sintering of conductive tracks causes high process costs. On the other hand, planar build-up and connection techniques based on phototechnology and electroplating mean highly complex production processes.

Disadvantageously, with such planar build-up and connection techniques, for example as a result of agglomerates in an applied sintering paste, stresses or fractures can occur or delaminations can occur during production or during operation of electronic modules. A delamination between conductive track and insulation, in particular, can lead to air gaps and, on account of that, to partial discharges that cause premature failure of such electronic modules.

SUMMARY

Teachings of the present disclosure may be employed to provide a method for producing conductive tracks which firstly can be implemented simply and cost-effectively and which at the same time allows production with high thermal shock stability and with high strength to withstand partial discharges. Furthermore, the teachings herein may be used to specify an electronic module which has a high thermal shock stability and a high strength to withstand partial discharges. For example, some embodiments include a method for producing a least one conductive track (130), wherein a surface (50) formed by thermoplastic (90) is used and conductive track material is deposited on the surface (50) by means of thermal spraying.

In some embodiments, the conductive track material (130) comprises conductive material or a material which is able to be converted into an electrically conductive material by treatment, in particular heating or irradiation, e.g. UV irradiation.

In some embodiments, the surface formed by thermoplastic (90) is used by virtue of the surface formed by thermoplastic (90) first being produced.

In some embodiments, wherein the surface formed by thermoplastic (90) is produced by means of coating, in particular dispensing and/or jetting and/or screen printing.

In some embodiments, polyamide-imide and/or polyimide and/or polyarylether and/or BMI and/or polyamide and/or functionalized polyamides and/or polyether ether ketone (PEEK) and/or PES, in particular in a mixture with at least one thermosetting plastic, is used as thermoplastic (90).

In some embodiments, the conductive track (130) is structured by means of at least one stencil and/or by means of thermosetting plastic.

In some embodiments, the thermal spraying is effected with particles (110) having a temperature of at least 800 degrees Celsius, e.g. at least 1083 degrees Celsius, and/or with particles (110) having an oxide proportion of at most 10 percent, e.g. at most 5 percent, and/or with particles having a velocity of at most 700 m/s, e.g. at most 500 m/s.

In some embodiments, the particles (110) are formed with copper and/or silver and/or gold and/or aluminum and/or nickel and/or tin and/or an alloy comprising one or more of the aforementioned metals.

In some embodiments, the conductive track material is deposited at least regionally as a layer having a layer thickness (d) of at least 10 micrometers, at least 20 micrometers, and/or at least 30 micrometers.

In some embodiments, the at least one conductive track is embodied on an electronic module, in particular a power module.

As another example, some embodiments include an electronic module, in particular a power module, comprising a surface formed by a thermoplastic (90), a thermally sprayed conductive track (130) being arranged on said surface.

In some embodiments, the electronic module as described herein may be produced by a method as described herein.

In some embodiments, there is at least one electrical and/or electronic component (70) electrically conductively connected to the conductive track (130).

In some embodiments, the surface formed by thermoplastic (90) at least partly forms a layer of at least one component (70) and/or of a circuit carrier (10).

BRIEF DESCRIPTION OF THE DRAWINGS

The teachings herein are explained in greater detail below on the basis of an exemplary embodiment illustrated in the drawings, in which.

DETAILED DESCRIPTION

Figure 1:
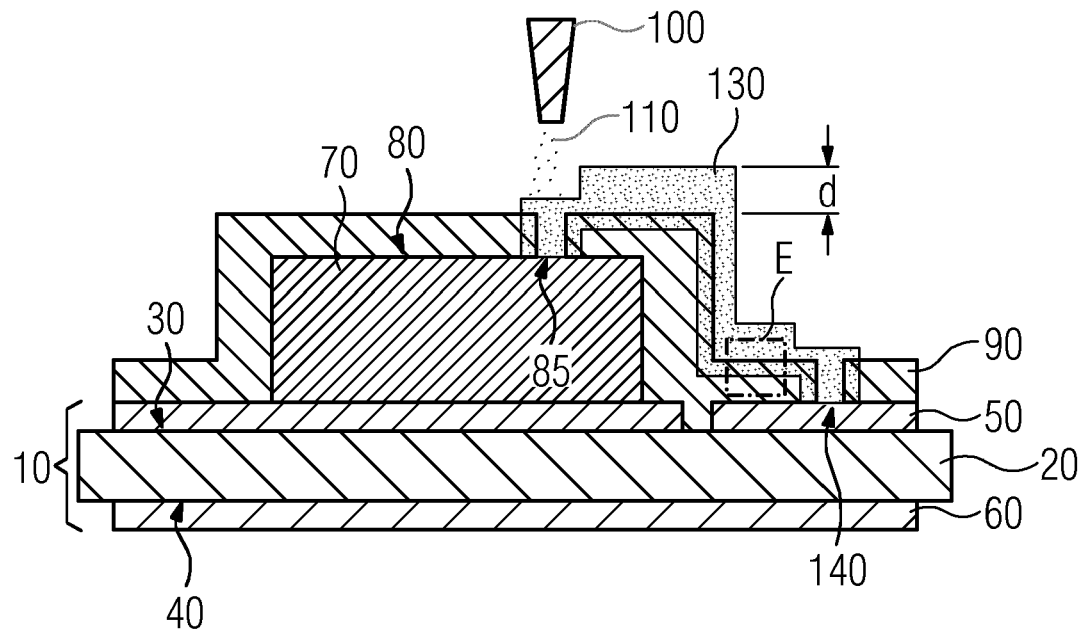
FIG. 1 shows an arrangement schematically in cross section during the implementation of a step of a method incorporating teachings of the present disclosure for producing a conductive track, wherein particles of conductive track material are thermally sprayed onto a surface formed by thermoplastic in order to manufacture an electronic module.

In the methods taught herein for producing at least one conductive track, at least one surface formed by thermoplastic is used and conductive track material is deposited on the surface formed by thermoplastic by means of thermal spraying. Consequently, by means of the method, conductive track material is deposited in such a way that particles formed by conductive track material, by means of thermal spraying, that is to say particles having a hot surface temperature, are applied to the surface formed by thermoplastic. On account of the high surface temperature of the particles and/or on account of the kinetic energy of the particles, the particles emit kinetic and thermal energy to the thermoplastic, which deforms as a result, and is even melted, such that the particles that are firstly sprayed onto the surface can completely or partly penetrate into the thermoplastic and can be enclosed by thermoplastic.

With continued thermal spraying, the surface formed by thermoplastic transforms into a boundary region in which, remote from the surface, thermoplastic prevails almost completely and within the boundary region the proportion of the thermoplastic decreases in favor of an increasing proportion of the conductive track material. At the surface of said boundary region, on the other hand, the prevailing density of particles formed by conductive track material is so high that conductive track material further deposited onto said surface of the boundary region easily adheres thereto.

In a suitable manner, the quantity of energy of the particles during thermal spraying is low enough, and conversely the enthalpy of fusion of the surface formed by thermoplastic is high enough, to avoid overheating of the surface formed by thermoplastic and thus thermal decomposition of thermoplastic material of the surface formed by thermoplastic. In an expedient manner, on the other hand, the energy of the particles is high enough that the particles deform upon impinging on already deposited particles of conductive track material and combine cohesively with already deposited particles.

In some embodiments, therefore, the conductive track material is interlocked with the surface formed by thermoplastic in a positively locking and force-locking manner, such that the conductive track can be produced on the surface formed by thermoplastic particularly securely to withstand delamination and, consequently, no air gaps can arise between the surface formed by thermoplastic and the conductive track. Consequently, one or more conductive tracks can be produced on the surface formed by thermoplastic with a high strength to withstand partial discharges. On account of the material gradients in the boundary region, when considered on size scales which exceed the particle sizes of the deposited material, there are no abrupt differences in the coefficient of thermal expansion. Consequently, a high thermal shock stability of the conductive tracks produced on the surface formed by thermoplastic is realized by means of the methods described herein.

In some embodiments, the at least one conductive track can be produced particularly rapidly and simply, i.e. with a particularly small number of process steps and therefore particularly cost-effectively. In some embodiments, the conductive track material deposited during thermal spraying easily adheres to the surface formed by thermoplastic, but not to thermosetting plastic, such that the at least one conductive track is able to be structured particularly simply.

In some embodiments, the areal linking, without air gaps, of the at least one conductive track to the surface formed by thermoplastic has a particularly low inductance. On account of the planar contacting of the components, heat can be dissipated from them particularly simple by means of the method according to the invention, since it is not necessary for structural space to be kept available by way of space-demanding build-up and connection technology.

In some embodiments, the entire contact area of components and/or assemblies to be contacted can be used for contacting.

The methods described herein allow a particularly high integration since components can be arranged and electrically contacted very close to one another. In particular, it is not necessary to take account of a bond loop as in the case of wire bonding, for instance.

The term thermal spraying expediently forms a generic term for a plurality of more specific technologies. In the context of this disclosure, thermal spraying can be effected by means of atomization from a melt, in particular by means of melt bath spraying, and/or by means of electric arc or gas discharge, by means of arc spraying or plasma spraying, by means of gas expansion without combustion, in particular by means of cold gas spraying, and/or by means of combustion, in particular by means of wire flame spraying and/or powder flame spraying and/or high-speed flame spraying and/or detonation spraying, and/or by means of a focused energetic beam, in particular by means of laser spraying.

The thermoplastic expediently is or comprises a high-temperature polymer which exhibits a thermoplastic behavior at its surface, such that thermally sprayed particles can fuse with the thermoplastic.

In some embodiments, the conductive track material comprises electrically conductive material and/or a material which is able to be converted into an electrically conductive material by treatment, in particular heating or irradiation, preferably UV irradiation. A conductive track material within the meaning of this disclosure should thus be understood expediently not necessarily to be electrically conductive material, rather the conductive track material can be formed by means of a material which only acquires an electrical conductivity by way of further, subsequently, treatment. In a suitable manner, the conductive track material comprises copper and/or silver and/or gold and/or aluminum and/or nickel and/or tin and/or an alloy comprising one or more of the aforementioned metals.

In some embodiments, the surface formed by thermoplastic is used by virtue of the surface formed by thermoplastic first being produced.

In some embodiments, the surface formed by thermoplastic is produced by means of coating, in particular dispensing and/or jetting and/or screen printing. In some embodiments, the surface formed by thermoplastic can be produced by a circuit carrier which is intended to be provided with conductive tracks being used and the circuit carrier being at least partly treated with a layer formed by thermoplastic, such that an outer surface of said layer constitutes or comprises the surface formed by thermoplastic.

In some embodiments, polyamide-imide and/or polyimide and/or polyarylether and/or BMI and/or polyamide and/or functionalized polyamides and/or polyether ether ketone (PEEK) and/or PES, are/is used as thermoplastic. In some embodiments, the thermoplastic is used in a mixture with at least one thermosetting plastic. Polyimide, polyamide-imide, polyarylether, BMI or functionalized polyamides comprise aromatic polymer units which entail a good thermal stability and good adhesion. They are soluble in selected solvents and their solution is stable during storage at room temperature. Polyamide-imide, polyimide, BMI, polyamides, polyimides, polyether ether ketone (PEEK) and PES, in particular, advantageously have a very high glass transition temperature and/or a high melting point.

In some embodiments, a material having a high glass transition temperature of at least 250 degrees Celsius and/or having a high short-term thermal stability of at least 250 degrees Celsius and/or having a high modulus of elasticity of at least 500 MPa at 25° C. is used as thermoplastic. In a suitable manner, a material having the highest possible flexibility and/or the highest possible impact strength and/or the lowest possible ion content is used as thermoplastic. In a suitable manner, a material having a coefficient of thermal expansion that deviates as little as possible in comparison with a circuit carrier which is preferably present and on which the at least one conductive track is produced, and/or in comparison with a component which is preferably present and which is electrically contacted with the preferably one conductive track, and/or having the least possible moisture absorption and/or the highest possible breakdown strength and/or having the best possible adhesion is used as thermoplastic.

In some embodiments, the thermal spraying is effected with particles having a temperature of at least 800 degrees Celsius or of at least 1083 degrees Celsius. What is achieved with such a temperature is that the particles impinge on the surface with a sufficiently hot surface temperature and, for instance in the case of copper at more than 1083 degrees Celsius, are subjected to a sufficiently high deformation, such that a particularly good areal adhesion of the conductive track material is achieved. Partial discharges on account of air pores between conductive track material and surface can be effectively avoided on account of the high areal adhesion of the conductive track material.

In some embodiments, the thermal spraying is effected with particles having an oxide proportion of at most 10 percent, preferably at most 5 percent, such that a sufficiently high electrical conductivity is achieved. In some embodiments, the thermal spraying is effected with particles having a porosity of less than 50 percent, in order to achieve a sufficiently high electrical conductivity. In some embodiments, the thermal spraying is effected with particles having a velocity of at most 700 m/s, or of at most 500 m/s. Such a low velocity of the particles ensures that the particles do not destroy surfaces, for instance of semiconductor components such as semiconductor chips or of electrical contacts.

In some embodiments, the particles are formed with copper and/or silver and/or gold and/or aluminum and/or nickel and/or tin and/or an alloy comprising one or more of the aforementioned metals.

In some embodiments, the conductive track material is deposited at least regionally as a layer having a thickness, i.e. layer thickness, of at least 10 micrometers, or at least 20 micrometers, or at least 30 micrometers. In this way, the conductive track material is deposited with a sufficiently large layer thickness allowing efficient current conduction.

In some embodiments, the at least one conductive track or the conductive tracks is/are embodied on an electronic module, in particular a power module.

In some embodiments, the electronic modules is a power module and comprises a surface formed by a thermoplastic, a thermally sprayed conductive track being arranged on said surface.

In some embodiments, the electronic module comprises at least one or a plurality of electrical and/or electronic components which are electrically conductively connected to the conductive track. In some embodiments, the electrical and/or electronic components and also electrical contacts and/or component connections or component links present have a thermal stability of at least 200 degrees Celsius. In some embodiments, the electronic module can be produced by a plurality of method variants of thermal spraying, without the components being detrimentally affected.

In some embodiments, the surface formed by thermoplastic at least partly forms a layer of at least one component and/or of a circuit carrier.

During the production of a power module incorporating the teachings herein as illustrated in FIG. 1, firstly a circuit carrier 10 is used. The circuit carrier 10 comprises, in a manner known per se, a ceramic plate 20 having two flat sides 30, 40, which face away from one another and are parallel to one another and extend in a planar fashion and respectively have a copper metallization 50, 60, which respectively form a copper layer extending along the flat side 30, 40 and having a homogeneous thickness. In principle, some other circuit carrier can be provided in further exemplary embodiments, not illustrated separately.

A semiconductor component 70, an IGBT transistor (="Insulated Gate Bipolar Transistor") in the exemplary embodiment shown, is arranged on a copper metallization 50 of the circuit carrier 20 and has an electrical contact 85, for electrical linking on a side 80 facing away from the circuit carrier 20. In further exemplary embodiments, not specifically illustrated, some other electrical component is provided instead of a semiconductor component 70.

For the electrical linking of the semiconductor component 70, on a surface of the copper metallization 50 that is not occupied by the semiconductor component 70 and on sides of the semiconductor component 70 that do not bear against the copper metallization 50, a thermoplastic 90, polyamide-imide in the present case, is deposited in the manner of a layer having a homogeneous thickness of approximately 35 micrometers. Instead of polyamide-imide, in further exemplary embodiments, not specifically illustrated, a further thermoplastic, for example of the polyimide or polyarylether or BMI or polyamide or functionalized polyamides or polyether ether ketone (PEEK) or PES can also be present. In further exemplary embodiments, not shown separately, a mixture of the aforementioned plastics with one another or with a thermosetting plastic can be present. Therefore, the thermoplastic 90 need not necessarily be present as a pure single substance or as exclusively thermoplastic material. In the present case, the thermoplastic 90 serves as a primer for subsequently applied conductive tracks:

As conductive track, a metal layer is sprayed onto the thermoplastic 90 by means of thermal spraying. For this purpose, a stray nozzle 100 is used to spray metal particles 110, in the present case copper particles present as nanoparticles and having a radius of 500 nanometers or less, for example, onto the thermoplastic 90. In principle, in further exemplary embodiments, not specifically illustrated, other spraying particles can also be sprayed onto the thermoplastic, for example metal particles composed of or comprising aluminum and/or nickel and/or silver and/or gold and/or tin. In the exemplary embodiment illustrated, the thermal spraying of the metal particles 110 is effected by means of atomization from a melt, that is to say by means of melt bath spraying. In further exemplary embodiments, not specifically illustrated, the thermal spraying is effected by means of arc or gas discharge, for example by means of arc spraying or plasma spraying, or by means of gas expansion without combustion, for example by means of cold gas spraying, or by means of combustion, for example by means of wire flame spraying or powder flame spraying or high-speed flame spraying or detonation spraying, or by means of a focused energetic beam, for example by means of laser spraying.

Figure 2:
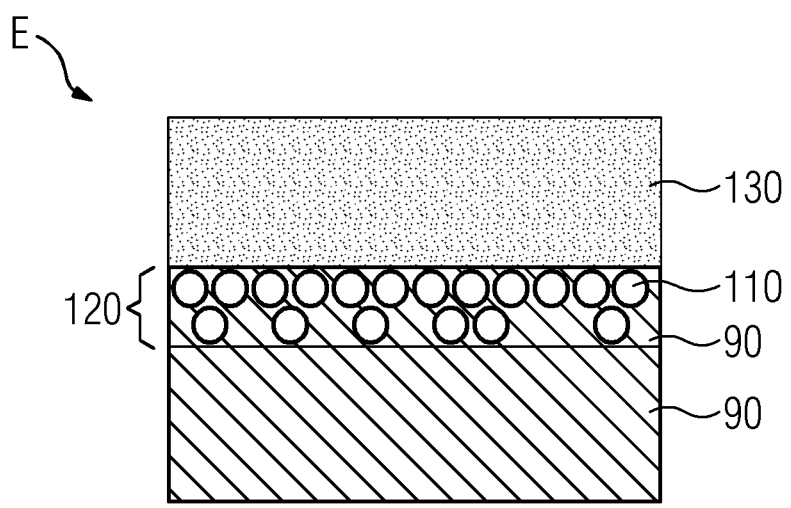
FIG. 2 shows schematically in cross section the surface formed by thermoplastic with the conductive track in accordance with FIG. 1.

By means of the thermal spraying, the metal particles 110 are sprayed onto the thermoplastic 90 with a surface temperature of more than 1083 degrees Celsius. Therefore, the metal particles 110 present as copper particles are subject to a significant deformation upon impact on the thermoplastic 90, such that the metal particles 110 enter into a particularly good areal adhesion with the thermoplastic 90. In addition, the enthalpy of fusion of the thermoplastic 90 is high enough that the metal particles 110 deform or melt the thermoplastic 90. The metal particles 110 first impinging on the thermoplastic 90 thus penetrate into the thermoplastic 90, wherein the thermoplastic 90 encloses these metal particles 110 (FIG. 2).

Continuing thermal spraying of the metal particles 110 results in a boundary region 120 (FIG. 2) containing the thermoplastic 90 and metal particles 110, such that the thermoplastic 90 combines with the metal particles 110 particularly well. In said boundary region 120, few metal particles 110 are situated near the circuit carrier 10, said metal particles therefore being introduced in the thermoplastic 90 in a positively locking manner. With increasing distance from the circuit carrier 10, the boundary region 120 contains an increasing density of metal particles 110, such that there is a transition gradient from thermoplastic 90 free of metal particles through to a high density of metal particles 110 that have penetrated into the thermoplastic 90. At the surface of the boundary region 120 remote from the circuit carrier 10, as thermal spraying is continued, further metal particles 110 are sprayed, which then do not penetrate further into the thermoplastic 90, but rather form a metal layer 130 bearing on the boundary layer 120.

The metal layer 130 is cohesively connected to the metal particles 110 situated on the surface of the boundary region 120 remote from the circuit carrier 10, such that the metal layer 130 is fixedly connected to the thermoplastic 90 by means of the boundary region 120. In this case, the metal layer 30 is sprayed with a layer thickness d of at least 20 micrometers onto the boundary region 120.

In some embodiments, the metal layer 130 is sprayed in the form of a conductive track which electrically links the contact 85 of the semiconductor component 70 and which electrically conductively connects said contact 85 of the semiconductor component expediently to an electrical contact 140 of the circuit carrier 20.

What is claimed is:

1. A method for producing a least one conductive track on a substrate, the method comprising:
   forming a surface on the substrate by coating the substrate with a mixture including a thermoplastic; and
   depositing track material to the surface by thermal spraying a first multiplicity particles of the track material at a temperature sufficient to melt and deform the thermoplastic such that the first multiplicity of particles at least partially penetrate the thermoplastic; and
   depositing additional track material by thermal spraying additional particles of the track material to adhere to the first multiplicity of particles.

2. The method as claimed in claim 1, wherein the track material comprises a material converted into an electrically conductive material by heating or irradiation.

3. The method as claimed in claim 1, wherein the thermoplastic comprises at least one material selected from the group consisting of: polyamide-imide, polyimide, polyarylether, BMI, polyamide, functionalized polyamides, polyether ether ketone (PEEK), and PES.

4. The method as claimed in claim 1, further comprising constructing the conductive track using a stencil and/or a thermosetting plastic.

5. The method as claimed in claim 1, wherein the thermal spraying comprises spraying particles at a temperature of at least 800 degrees Celsius and/or particles having an oxide proportion of at most 10 percent and/or particles having a velocity of at most 700 m/s.

6. The method as claimed in claim 5, wherein the particles comprise at least one element selected from the group consisting of: copper, silver, gold, aluminum, nickel, and tin.

7. The method as claimed in claim 1, wherein the conductive track material is deposited at least regionally as a layer having a layer thickness of at least 10 micrometers.

8. The method as claimed in claim 1, wherein the conductive track is part of an electronic module.

\* \* \* \* \*